United States Patent
Reich et al.

(10) Patent No.: US 7,091,530 B1
(45) Date of Patent: Aug. 15, 2006

(54) HIGH-SPEED, HIGH-SENSITIVITY CHARGE-COUPLED DEVICE WITH INDEPENDENT PIXEL CONTROL OF CHARGE COLLECTION AND STORAGE

(75) Inventors: Robert K. Reich, Tyngsborough, MA (US); Bernard B. Kosicki, Acton, MA (US); Jonathan C. Twichell, Acton, MA (US); Barry E. Burke, Lexington, MA (US); Dennis D. Rathman, Ashland, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/612,174

(22) Filed: Jul. 2, 2003

Related U.S. Application Data

(60) Provisional application No. 60/394,125, filed on Jul. 3, 2002.

(51) Int. Cl.
*H01L 27/148* (2006.01)
(52) U.S. Cl. .................. 257/222; 257/213; 257/215; 257/216; 257/E27.15
(58) Field of Classification Search ............ 257/223, 257/229, 230, 228, 231; 348/311, 312, 313, 348/314, 315, 316, 317, 318, 319, 320, 321, 348/322, 323, 324
See application file for complete search history.

(56) References Cited

U.S. PATENT DOCUMENTS

| 4,322,638 | A | 3/1982 | Lee et al. |
| 4,322,752 | A | 3/1982 | Bixby |
| 4,835,616 | A | 5/1989 | Morcom |
| 5,270,558 | A * | 12/1993 | Reich et al. |
| 5,355,165 | A | 10/1994 | Kosonocky et al. |
| 5,585,847 | A * | 12/1996 | Sayag |
| 5,754,228 | A | 5/1998 | Dyck |
| 5,754,229 | A | 5/1998 | Elabd |
| 5,796,433 | A | 8/1998 | Dyck |
| 5,867,215 | A | 2/1999 | Kaplan |
| 5,953,061 | A | 9/1999 | Biegelsen et al. |

(Continued)

FOREIGN PATENT DOCUMENTS

WO      WO 97/46004      12/1997

OTHER PUBLICATIONS

Reich et al. "High-Fill-Factor, Burst-Frame-Rate Charge-coupled Device," International Electron Device Meeting and IEDM Technical Digest, pp. 567-570, Dec. 2001.*

(Continued)

*Primary Examiner*—Nathan J. Flynn
*Assistant Examiner*—Ken Quinto
(74) *Attorney, Agent, or Firm*—Theresa A. Lober

(57) ABSTRACT

A charge-coupled device imager including an array of super pixels disposed in a semiconductor substrate having a surface that is accessible to incident illumination. For each super pixel there is provided a plurality of subpixels which each correspond to one in the sequence of image frames. Each subpixel includes a doped photogenerated charge collection channel region opposite the illumination-accessible substrate surface, a charge collection channel region control electrode, doped charge drain regions adjacent to the channel region, a charge drain region control electrode, and a doped charge collection control region. To each subpixel are provided channel region and drain region control voltage connections, for independent collection and storage of photogenerated charge from the substrate at the charge collection channel region of a selected subpixel during one in the sequence of image frames and for drainage of photogenerated charge from the substrate to a drain region.

24 Claims, 12 Drawing Sheets

U.S. PATENT DOCUMENTS 6,037,822 A * 3/2000 Rao et al.
6,049,357 A 4/2000 Shinohara
6,218,692 B1 4/2001 Guidash et al.

OTHER PUBLICATIONS

Reich et al., "Integrated Electronic Shutter for Back-Illuminated Charge-coupled Devices," IEEE Transactions on Electron Devices, vol. 40, No. 7, pp. 1231-1237, Jul. 1993.*

Fujita et al., "A New High-Speed Camera System for Broadcast Use—The Action Analyzer," SMPT Journal, pp. 820-823, Oct. 1990.

Reich et al., "Integrated Electronic Shutter for Back-Illuminated Charge-Coupled Devices," IEEE Transactiosn on Electron Devices, vol. 40, No. 7, pp. 1231-1237, Jul. 1993.

Kabra et al., "180×180 Element Ultra High Frame Rate Burst Image Sensor," Proc. of the 40th Midwest Symp. on Circuits & Systems, Sacramento, CA, pp. 1423-1425, Aug. 2-6, 1997.

Kosonocky et al., "360×360 Element Three-Phase Very High Frame Rate Burst Image Sensor: Design, Operation, and Performance," IEEE Transactions on Electron Devices, vol. 44, No. 10, pp. 1617-1624, Oct. 1997.

Yates et al., "An intensified/shuttered cooled CCD camera for dynamic proton radiography," In "Digital Solid State Cameras: Designs and Applications," Williams, Jr., Editor, SPIE vol. 140, pp. 140-151, Apr. 1998.

Rathman, "Trasient Analysis of Photogenerated Charge-Carrier Collection in High-Frame-Rate Charge-Coupled Devices," MIT Lincoln Laboratory Solid State Research Quarterly Technical Report, pp. 25-30, Sep. 1, 1999.

Hartmann et al. "A high-speed frame store CCD for the use in optical and near infrared astronomy," In "Adaptive Optical Systems Technology," Wizinowich, Ed., Proc. SPIE vol. 4007, pp. 493-499, 2000.

O et al., "6k-pixel 160-MHz CCD linescan sensor," In "Sensors and Camera Systems for Scientific, Industrial, and Digital Photography Applications," Blouke et al., Eds., Proc. SPIE vol. 3965, pp. 50-57.

Reich et al., "Burst-Frame-Rate CCD Imager," MIT Lincoln Laboratory Solid State Research Quarterly Technical Report, pp. 25-29, Sep. 7, 2001.

Reich et al., "High-Fill-Factor, Burst-Frame-Rate Charge-Coupled Device," International Electron Device Meeting and IEDM Technical Digest, pp. 567-570, Dec. 2001.

Reich et al., "High-Speed Electronically Shuttered Solid-State Imager Technology," Proc. 14th Topical Conference on High-Temp Plasma Diagnostics, Jul. 8-11, 2002, and Review of Scientific Instruments, V. 74, Part 2, pp. 2027-2031, Mar. 2003.

* cited by examiner

ON-CHIP | OFF-CHIP

FIG.6A

| | STATE 1 | STATE 2 | STATE 3 |
|---|---|---|---|
| IA1-A | | | |
| IA1-B | | | |
| IA1-C | | | |
| IA1-D | | | |
| IA2-A | | | |
| IA2-B | | | |
| IA2-C | | | |
| IA2-D | | | |
| IA3 | | | |
| SD | | | |
| SR1 | | | |
| SR2 | | | |
| SR3 | | | |
| CBR1 | | | |
| CBR2 | | | |
| CBR3 | | | |
| SG | | | |
| RG | | | |
| STATE | 1 | 2 | 3 |
| | FRAME A CAPTURE | FRAME B CAPTURE | FRAME C CAPTURE |

HIGH-SPEED, HIGH-SENSITIVITY CHARGE-COUPLED DEVICE WITH INDEPENDENT PIXEL CONTROL OF CHARGE COLLECTION AND STORAGE

This application claims the benefit of U.S. Provisional Application No. 60/394,125, filed Jul. 3, 2002, the entirety of which is hereby incorporated by reference.

STATEMENT REGARDING FEDERALLY SPONSORED RESEARCH

This invention was made with Government support under Contract No. F19628-00-C-0002, awarded by the Department of Air Force. The Government has certain rights in the invention.

BACKGROUND OF INVENTION

This invention relates generally to charge coupled devices (CCDs), and more particularly relates to the design of charge coupled devices for high-speed imaging.

High-speed imaging is important for a wide range of applications, such as high-speed photography and video. Typically, a high-speed imaging application requires the acquisition of a sequence of image frames at an accelerated rate, resulting in a high rate of image frame data collection. For example, frame rates of greater than 1 million frames per second can be required for specialized imaging applications.

Many solid state imagers, such as CCDs, require a fixed duration of time for transferring a frame of acquired image data from on-chip image acquisition locations, such as an array of pixels, to off-chip locations for display or processing. With this constraint, it can occur with a conventional imager that the time required to transfer an acquired image frame from on-chip pixel sites to an off-chip location is comparable to or greater than the image acquisition time set by the frame rate of a high-speed imaging application. In such a scenario, image data from an acquired image frame cannot be transferred from pixel sites with a speed sufficient to enable acquisition of image data in the next succeeding image frame duration. The image transfer time thereby in general sets the maximum speed at which an imager can acquire images, and correspondingly limits the frame rate that can be accommodated by an imager.

There have been suggested various CCD imager designs that enable accommodation of an image transfer duration that is comparable with an image acquisition period. Many such designs employ the use of an image data storage region located on-chip, e.g., as a frame storage array separate from an imaging pixel array, or as a storage channel provided at or adjacent to a pixel site itself. Typically such storage regions are provided with an overlaying opaque blocking layer that prevents exposure of the storage region by a scene being imaged, such that the stored image data is preserved for transfer off-chip at a later time and/or at a slower speed than that provided by the image acquisition duration.

Such on-chip storage configurations are known to impose various limitations on imager performance. For example, for conventional imager designs, on-chip area that is employed for charge storage regions is typically taken from pixel areas that would have been employed for acquiring images; as a result, the pixel fill factor of the imager is greatly reduced over that of an imager without on-chip storage, and the sensitivity of the imager is correspondingly reduced. In addition, so-called image smear can occur in pixel data transferred from a pixel array to a frame-storage array.

These drawbacks are exacerbated for high-speed imaging applications in which a number of images are to be acquired in rapid succession. If on-chip area is to be provided for temporarily storing image data from a sequence of acquired images, the extent of the image data storage area must be commensurate with the number of images in the image sequence to be acquired. This typically results in significant imager sensitivity reduction and/or increased image smear. Thus, in general, for high-speed imaging applications, it has come to be expected that degradations in image quality must be accommodated, and in particular that high imaging sensitivity cannot be achieved at high image frame rates.

SUMMARY OF THE INVENTION

The invention overcomes the constraints of conventional CCD imager design to enable high-speed acquisition of a sequence of image frames while preserving a high degree of image sensitivity. The charge-coupled device imager of the invention includes an array of super pixels disposed in a semiconductor substrate having a surface that is accessible to incident illumination. For each super pixel there is provided a plurality of subpixels. Each subpixel of a super pixel corresponds to a frame in the sequence of image frames.

Each subpixel includes a doped photogenerated charge collection channel region opposite the illumination-accessible substrate surface, a charge collection channel region control electrode, doped charge drain regions adjacent to the channel region, a charge drain region control electrode, and a doped charge collection control region.

In accordance with the invention, there can be provided to each subpixel a channel region control voltage connection. This control voltage connection is provided on the substrate surface opposite the illumination-accessible surface. Each subpixel channel region control voltage connection is configured for independent collection and storage of photogenerated charge from the substrate at the charge collection channel region of a selected subpixel during a corresponding frame in the sequence of image frames. There can further be provided a drain region control voltage connection to each subpixel on the substrate surface opposite the illumination-accessible surface. Each subpixel drain region control voltage connection is configured for drainage of photogenerated charge from the substrate to a subpixel drain region in response to a drain region control signal.

In accordance with the invention, the subpixel channel region control voltage connection can be configured for collection and storage of photogenerated charge from the substrate at the charge collection channel region of at least two subpixels during a corresponding frame in the sequence of image frames. Further, the subpixel channel region control voltage connection can be configured for subpixel-specific weighting of collection and storage of photogenerated charge from the substrate at each subpixel. In addition, the subpixel channel region control voltage connection can be configured for control of the correspondence between subpixels and image frames, and/or for independent collection and storage of photogenerated charge from the substrate at the charge collection channel region of a subpixel during a corresponding frame in multiple sequences of image frames.

The subpixel channel region control voltage connection can be provided as metal control signal lines for delivering voltage control signals to the charge collection channel region control electrodes and the charge drain control electrodes. In this scenario, there can be provided semiconducting isolation lines between the metal control signal lines and the charge collection channel region control electrodes and the charge drain control electrodes.

A serial output register can be connected to accept a sequence of image frame charge from each super pixel after the image frame sequence is collected and stored at each super pixel. Further, a column binning register can be connected to the serial output register to accept and sum image frame charge from columns of super pixels. For many applications, it can be preferred to provide the serial output register and the column binning register disposed in the semiconductor substrate with the array of super pixels.

In accordance with the invention, the number of subpixels included in each super pixel can be selected based on the length of the image frame sequence and on the frame rate. In this scenario, the selection is provided to collect photogenerated charge from each frame in the image frame sequence by at least one corresponding subpixel of the super pixel and store the collected charge at the corresponding subpixel as other subpixels collect photogenerated charge from other frames in the image frame sequence.

The number of subpixels can be further based on the charge collection efficiency that is characteristic of photogenerated charge in the substrate. This consideration is made to enable collection of substantially all photogenerated charge from the substrate at prespecified subpixels during a corresponding frame. Further, the number of subpixels can be selected to collect and store at the super pixel each frame of the image frame sequence before transferring the image frame sequence from the super pixel. As an example, at least two subpixels can be provided corresponding to each frame in the image frame sequence.

The charge collection channel region, the charge drain regions, and the charge collection control layer are each characterized by a dopant type and dopant concentration for expanding the charge collection channel region in response to a charge collection control voltage applied to the channel region control electrode. This is to collect in the charge collection channel region photogenerated charge from the substrate during the image frame corresponding to a given subpixel. The dopant concentrations further are for contracting the collection channel region in response to a charge storage control voltage applied to the channel region control electrode. This is to store the collected photogenerated charge in the charge collection channel region and collect substantially no additional photogenerated charge as other subpixels of the super pixel collect photogenerated charge corresponding to other frames of the image frame sequence.

The semiconductor substrate can here be provided as, e.g., a p-type silicon substrate, with the charge collection channel region provided as an n-type region, the charge drain regions provided as n-type regions, and the charge collection control layer provided as a p-type layer. In particular, the substrate can be provided as a p$^-$ silicon substrate, the charge drain regions provided as n$^+$ regions, and the charge collection control layer provided as a p$^+$ layer.

In accordance with the invention, the charge collection channel region can be provided as a buried channel that is disposed adjacent to the substrate surface opposite the illumination-accessible substrate surface. Here the charge collection control layer can include first sections that are at a first depth in the substrate and located under a first section of the charge collection channel region and all of the charge drain regions, and include second sections that are at a second depth in the substrate different than the first depth and located under a second section of the charge collection channel region.

The charge collection control voltage can be selected to expand a depletion region of the charge collection channel region into the substrate to a depth greater than a depth of the charge collection control layer, and to contract a depletion region of the charge collection channel region into the substrate to a depth less than a depth of the charge collection control layer. Further, a charge drain control voltage can be selected to expand a depletion region of the charge drain regions to a depth greater than a depth of the charge collection control layer.

In accordance with the invention, the illumination-accessible substrate surface is a back side of the substrate, and the control electrodes are disposed on a front side of the substrate. The charge collection channel region control electrode can be provided as three electrodes corresponding to three-phase photogenerated charge collection by the charge collection channel region.

The CCD imager of the invention is particularly well-suited for a wide range of scientific and commercial applications in which high-speed imaging as well as high image sensitivity are required. Other features and advantages of the CCD of the invention will be apparent from the following description and accompanying drawings, and from the claims.

DESCRIPTION OF THE DRAWINGS

FIGS. 6A–6D are timing diagrams for control signals in an example operation of the CCD imager system of FIG. 1;

DETAILED DESCRIPTION OF THE INVENTION

Figure 1:
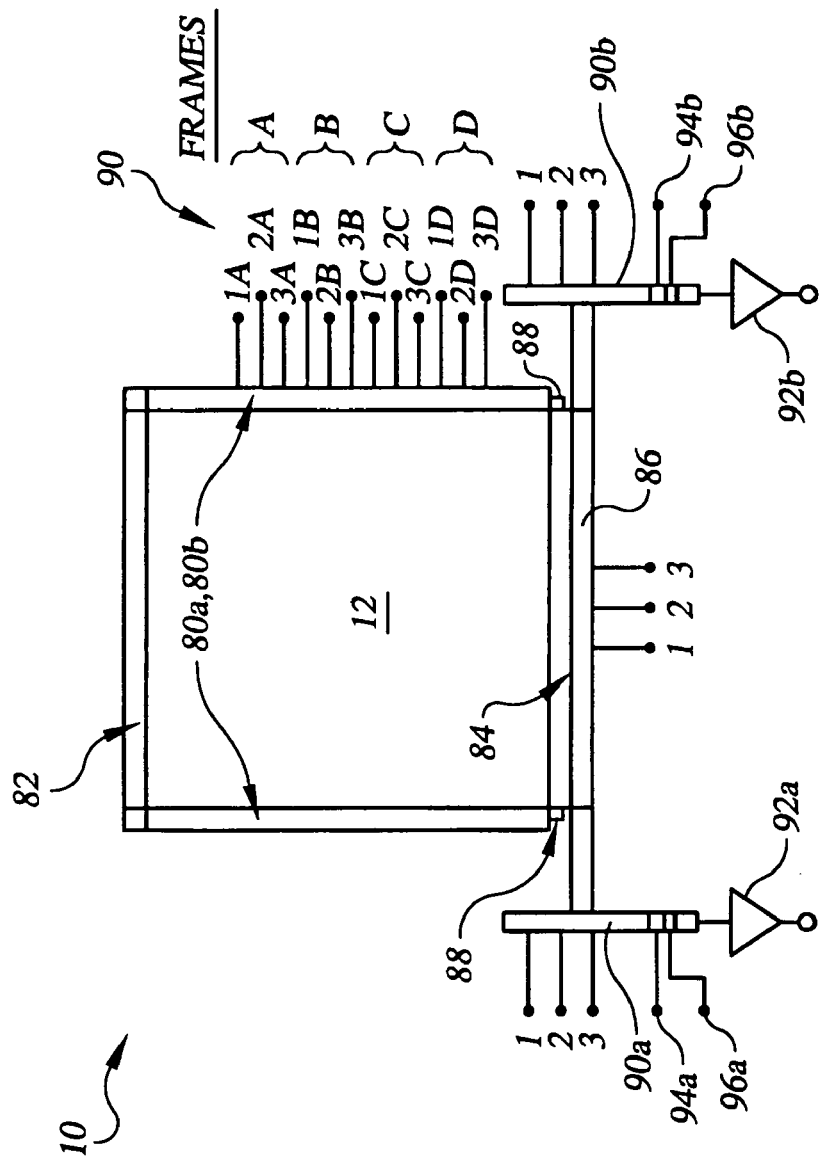
FIG. 1 is a schematic diagram of one example implementation of the CCD system of the invention.
Figure 2A:
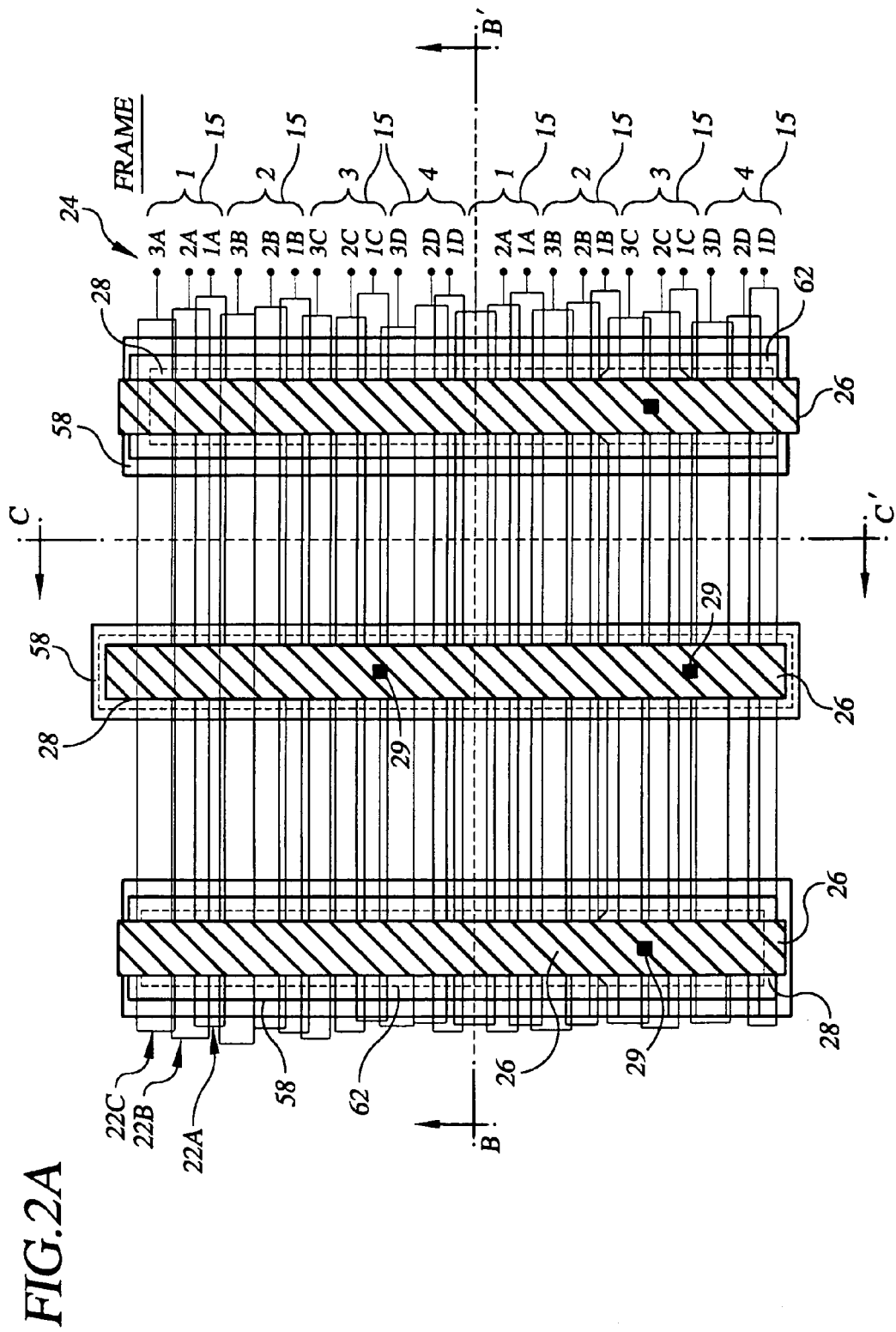
FIG. 2A is a plan view of a super pixel provided by the invention for the CCD imaging array of FIG. 1.
Figure 2B:
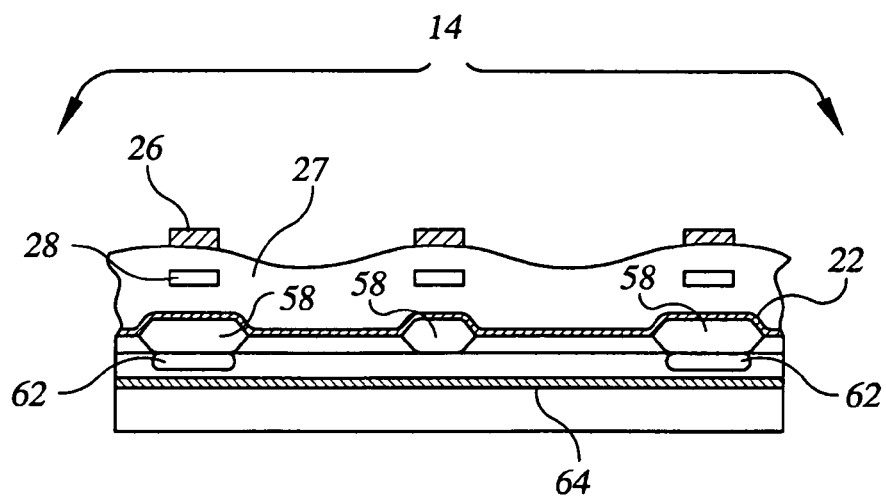
FIGS. 2B and 2C are cross sectional views of the super pixel of FIG. 2A.
Figure 2C:
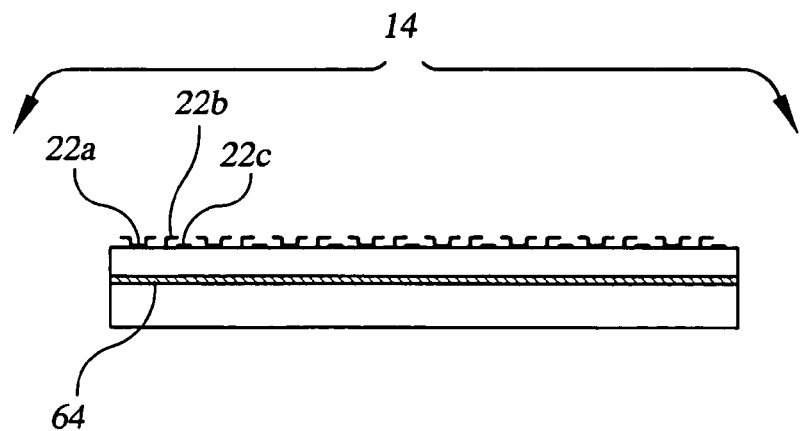

Referring to FIG. 1, there is shown a schematic diagram of one example implementation of the high-speed, high-sensitivity charge-coupled device system 10 of the invention. The CCD system includes a back-illuminated imaging array 12 having a full frame architecture, i.e., no frame-store array is required. Referring also to FIGS. 2A–2C, the imaging array is populated with rows and columns of super pixels 14. Each super pixel captures incident illumination and locally stores corresponding photogenerated charge for a prespecified number of image frames. In the example configuration shown in the figures, it is presupposed that each super pixel can capture and store a sequence of four image frames or fewer, but such is provided as an example only; as explained in detail below, the number of image frames to be collected and stored by a super pixel can be tailored for a given application. The image acquisition, charge storage, and charge transfer control provided by the imager for enabling this multi-frame operation is described in detail below. It is instructive to first turn to the super pixel design and operation.

Each super pixel is provided with a number of subpixels 15 that each include gate electrodes 22a, 22b, 22c. The number of subpixels provided for each super pixel corresponds to the number of image frames to be captured and stored by each super pixel, as explained below. With this configuration, each super pixel in the imager can collect and store an image sample for each image frame in the sequence of frames. Accordingly, it is the super pixels that set the spatial sampling resolution for the imager; i.e., the resolution of the imager is set by the number of super pixels provided for the imager array and the size of each super pixel. In this regard, the super pixels of the invention function as would a conventional pixel in setting the imager resolution.

The subpixels provided for each super pixel in the imaging array are configured in accordance with the invention to enable both collection and storage of image frame samples at the super pixel. This is achieved by the provision at each subpixel with a structure and with control electrodes and corresponding connections that together enable independent electronic shuttering of each subpixel in a super pixel. With such electronic control, each subpixel's electronic shutter can independently be set at an "open" state, in which case photogenerated charge from the substrate is collected by the subpixel, or independently set at a "closed" state, in which case previously collected photogenerated charge remains stored at the subpixel and no additional charge is collected. Details of this electronic shutter control design and operation are provided in U.S. Pat. No. 5,270,558, entitled, "Integrated Electronic Shutter for Charge-Coupled Devices," issued Dec. 14, 1993, to Reich et al., the entirety of which is hereby incorporated by reference.

In the acquisition and storage of a sequence of image frames in accordance with the invention, the electronic shutters of the subpixels in each super pixel are independently opened and closed, in step with the specified image frame rate. When a first image frame is to be acquired, the corresponding subpixel's shutter is opened, while the shutters of the remaining subpixels in a given super pixel are maintained closed. At the end of the first frame acquisition period, the open pixel shutter is closed and in the given super pixel, the next corresponding subpixel's shutter is opened to capture the next succeeding image frame. This process of subpixel shutter opening and closing is continued until the allotted number of image frames have been acquired by the super pixel. In this way, each super pixel of the imaging array collects and locally stores image samples for the entire image frame sequence.

Turning to the specifics of the subpixel design and the electronic shutter design and operation, there is shown in FIG. 2A a schematic plan view of a super pixel 14. In the example shown, there are provided eight subpixels 15, corresponding to capture of four image frames A, B, C, D, in the manner described below. Each subpixel of the super pixel can be operated by, e.g., a conventional three-phase control technique or other selected phased control; in this three-phase example, is thusly provided with three gate levels 22a, 22b, 22c, with each super pixel including connections 24 for independent three-phase gating control to each of the subpixel's gate levels.

Also as shown in FIGS. 2A and 2B, there are provided channel stops 25 in the conventional manner, for each subpixel. Control lines 26 are provided to each subpixel at contacts, e.g., through contact vias 29, as described below, for reducing clock signal propagation time to interior subpixel regions it can be preferred for many applications to provide such lines as metal lines. With this configuration, an isolation gate layer 28 can be included to electrically isolate the metal lines from the underlying subpixel gate electrodes. Other aspects of the subpixel layout will be presented below.

Figure 3A:
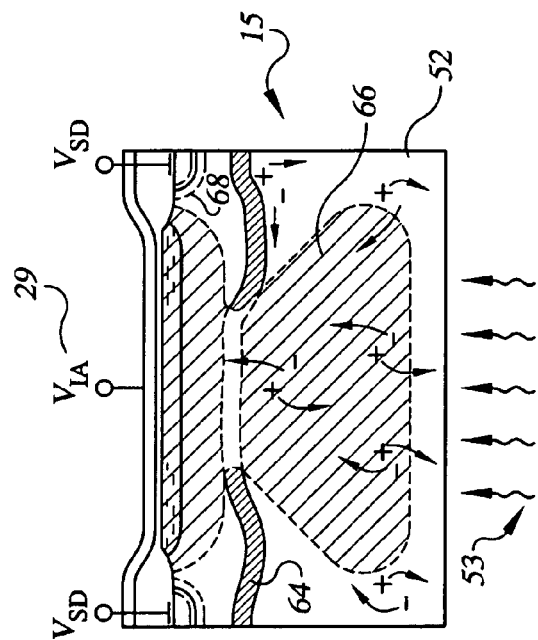
FIGS. 3A, 3B, and 3C–3D are cross-sectional views of a subpixel provided by the invention, illustrating the relative location of dopant within the pixel, illustrating an electronic shutter "open" state, and illustrating an electronic shutter "closed" state, respectively.

First turning to the subpixel electronic shutter design and operation, such can be understood with reference to FIGS. 3A–3D. In FIG. 3A there is shown a cross-sectional view of a single subpixel 15, not shown to scale for clarity, and illustrating the electronic doping profile of the subpixel. In an example configuration, the subpixel is fabricated in a lightly-doped, p-type silicon substrate, specifically, a p$^-$ silicon substrate 52, configured for illumination 53 of the backside 54 of the substrate with a heavily doped p$^+$ layer 56 provided at the backside of the substrate. Channel stop regions 58 are provided to electrically isolate a buried n-type electrical charge transfer channel 60. As can be recognized, in accordance with the invention this example dopant configuration can be reversed, employing an n-type substrate and corresponding dopant regions.

The subpixel's electronic shutter is implemented with n$^+$ dopant shutter drain regions 62 that are positioned between adjacent super pixels' transfer channels, and with a p-type buried layer 64. The buried layer 64 extends across the subpixel, preferably with a location-dependent depth; the buried layer is provided at a first depth in the substrate near the center of the n-type buried channel and at the locations of the shutter drain regions, and is at a lower substrate depth between these points. This buried layer vertical profile results in an electric field configuration that enables an electronic shutter action in the following manner.

Figure 3B:
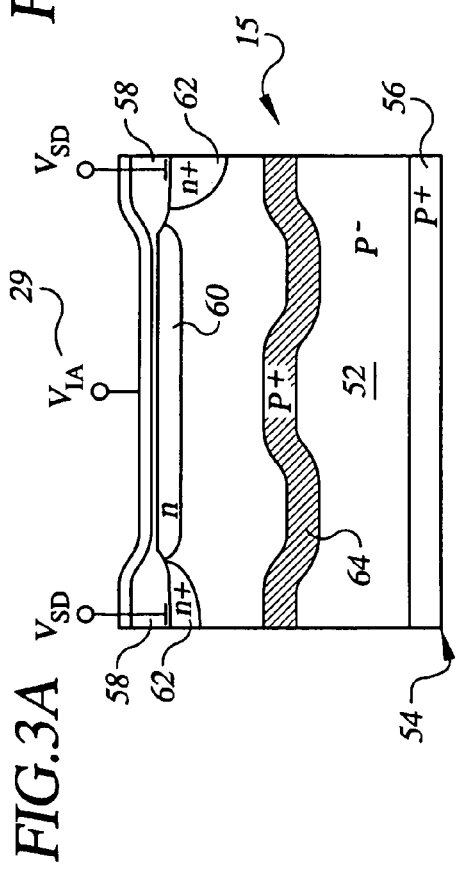

Referring to FIG. 3B, when it is desired to "open" the electronic shutter of the subpixel such that photogenerated charge, here photoelectrons, generated in the p-type substrate due to illumination of the substrate are captured by the subpixel, a charge collection control voltage, i.e., a corresponding imaging array bias voltage, $V_{IA}$, is applied to the subpixel gate electrodes to cause the electrical depletion region associated with the buried channel 60 to expand, forming a charge collection region 66 that extends from the buried channel location down through the p-type buried layer into the bulk region of the substrate 52. A charge drain control voltage, i.e., a corresponding shutter drain bias, $V_{SD}$, is applied to each shutter drain 62 to maintain the p-n junction of each shutter drain and the substrate in a reverse biased condition but limited such that the depletion region associated with the reverse biased junction does not extend beyond the p-type buried layer.

With this "open" shutter biasing, negatively charged photoelectrons that are generated in the p-type substrate, in the area of the corresponding super pixel, due to backside illumination of the substrate, are accelerated in the subpixel collection region 66 by the electric field resulting from the positive potential of the collection region relative to the substrate. Conversely, the undepleted p-type buried layer 64 creates an electric field that tends to repel the generated photoelectrons away from the shutter drain regions 62. As a result, photoelectrons tend to enter the collection region 66 relatively centrally under the channel 60, through the more shallow portion of the p-type buried layer 64 near the center of the subpixel.

An electrical potential barrier tends to repel photoelectrons from directly entering the buried channel 60 at the locations of the deeper p-type buried layer regions. This is enabled by selecting an the imaging array bias voltage that is not sufficient to deplete the deeper p-type buried layer, whereby an electric field created by the undepleted buried layer, similar to that produced by the shutter drain regions, repels the photoelectrons generated in the substrate. However, the electrical potential well in the n-type buried channel at locations adjacent to the deeper stretches of the p-type buried layer is more positive than that of the buried channel at its location adjacent to the more shallow stretch of the p-type buried layer. As a result, photoelectrons that migrate to the more shallow p-type buried layer region are transferred to the collection region portion above that stretch of the buried layer. Correspondingly, the central portion of the collection region 66 is insensitive to the number of photoelectrons that have migrated to that portion, up to a maximum amount. Collected photoelectrons beyond this maximum amount are shared between the upper and lower portions of the collection region, and tend to cause a collapse of the depletion region.

Figure 3C:
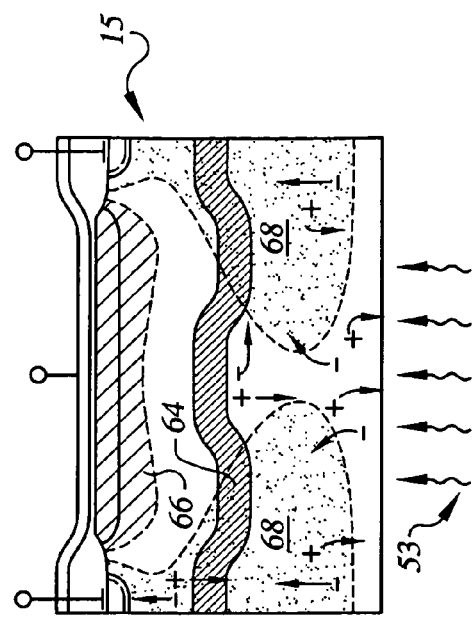

Referring now to FIG. 3C, "closure" of the electronic shutter is enabled by imposing a charge storage control voltage, i.e., a corresponding imaging array bias, $V_{IA}$, on the subpixel buried channel that is lower than the "open shutter" charge collection control voltage, and that causes the collection region 66 to contract such that it is located entirely vertically above the p-type buried layer 64. In this condition, an electrical potential barrier exists between the contracted collection region 66 and the p⁻ substrate due to the p⁺ buried layer 64. The electric field corresponding to this electrical potential barrier repels photoelectrons away from the contracted collection region 66, whereby the quantity of charge held in the collection region remains substantially fixed, i.e., no further photogenerated charge is added to the collection region even if/while the substrate continues to be illuminated 53.

In this shutter "closed" condition, the subpixel can be further controlled to direct photogenerated charge from the substrate in the region of the subpixel either to the shutter drain regions 62 or away from the subpixel, toward other subpixels, e.g., subpixels having open shutters. In this latter scenario, with the imaging array bias, $V_{IA}$, set as explained above to produce a contracted collection region 66, the applied shutter drain voltage, $V_{SD}$, is set to maintain the p-n junction of each shutter drain and the substrate in a reverse biased condition but limited such that the depletion region associated with the reverse biased junction does not extend beyond the p-type buried layer.

With this configuration, as shown in FIG. 3C, photoelectrons in the substrate are repelled from the subpixel collection region and are directed toward other subpixels having an expanded collection region like that shown in FIG. 3B. This control state therefore enables fixed storage of previously-collected charge at a subpixel as illumination continues, with photogenerated charge from the continued illumination being directed away from the subpixel such that no charge is added and the charge store remains substantially fixed. As explained in more detail below, this condition enables each super pixel to acquire frames of images in an image frame sequence while at the same time storing previously acquired frames of the sequence, for transfer of the frame sequence from the super pixel only after the entire sequence of frames has been collected.

Figure 3D:
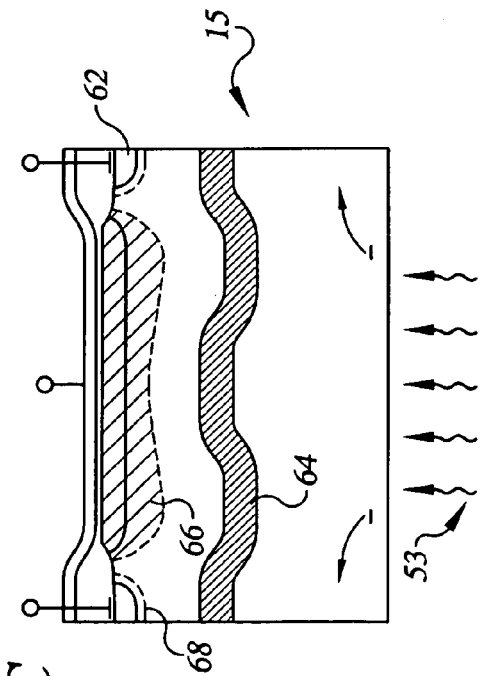

During operation of the imaging array, after collection of a specified sequence of image frames, the subpixel biases can be adjusted to extend the depletion region of the charge drains of the subpixels for draining of any charge that is further generated or that remains in the substrate, e.g., due to continued illumination of the substrate, or due to incomplete capture of previously photogenerated charge. In this scenario, as shown in FIG. 3D, the applied shutter drain voltage, $V_{SD}$, is increased above that applied in the "open" shutter mode, to produce shutter drain depletion regions 68 that extend vertically below the p-type buried layer deeper into the bulk of the substrate. Photoelectrons generated in the substrate are attracted to the more positive potential of these shutter drain depletion regions rather than the contracted collection region 66. As shown in FIG. 2A, the shutter drains 62 are connected for draining of this charge from the subpixel location in the substrate. In this control state, the subpixel maintains its fixed store of previously-collected charge and drains any additional charge from the substrate.

With this operation, in the shutter "open" control configuration, the n-type buried channel expands to a collection region 66 that captures photoelectrons generated in the substrate. The p-type buried layer prevents the photoelectrons from being attracted to the shutter drains, whereby substantially all photoelectrons are collected by the subpixel's collection region 66. Then, in the shutter "closed" control configuration, the contracted collection region 66 maintains its store of collected photoelectrons, without further addition of charge even as substrate illumination continues. In this state, the shutter drains can be biased to produce expanded shutter drain depletion regions for capturing additional photoelectrons in the substrate for drainage outside of the subpixel collection region 66; alternatively, the shutter drains can be biased as in the open shutter condition, to repel photoelectrons from the shutter-closed subpixel to nearby shutter-open pixels.

Turning back to the super pixel design, with this electronic shutter operation of the subpixels in each super pixel, the layout of each super pixel can be described more specifically. For a given application, the super pixel size is first determined based on, e.g., desired image resolution, or other considerations of the application. As described above, the number and size of super pixels included in the imaging array set the spatial sampling resolution of the imager. Then the frame rate required by a given application and the number of image frames to be captured in sequence by each super pixel are specified. With these parameters, the number of subpixels to be provided in each super pixel can be determined.

For optimal imager performance, it is desirable that substantially all photoelectrons generated in a given super pixel region of the CCD substrate during a single frame acquisition period be collected by the super pixel in that period. Given a specified super pixel size and specified frame acquisition period, this can be accomplished by providing subpixel regions in the super pixel in a spaced apart relationship that accounts for the diffusivity characteristics of photoelectrons generated in the substrate. In other words, there optimally is provided in the super pixel one or more subpixels for each frame that are spaced apart such that substantially all photoelectrons can reach at least one of the subpixels' collection regions within the frame acquisition period corresponding to the desired frame rate.

For example, as shown in FIGS. 2A–2C, for a super pixel architecture that is to capture a sequence of four image frames, there can be provided eight subpixels, with four sets of two subpixels, 1A and 2A, 1B and 2B, 1C and 2C, and 1D and 2D, designated for capturing the four image frames A, B, C, and D. Given a super pixel size of 96 microns square and a megahertz frame rate, the two subpixels corresponding to a given frame acquisition are spaced apart in the super pixel by no more than about 48 µm. For a p-type silicon substrate, this subpixel spacing ensures that substantially all photoelectrons generated in the super pixel during a given frame can be collected by the two designated subpixels. Thus, as shown in FIG. 2A, one half of the super pixel in this example includes subpixels corresponding to image frames A, B, C, and D, and the second half of the super pixel includes corresponding subpixels for frames A, B, C, and D.

The optimal subpixel spacing and number can be determined by employing, e.g., ATLAS, or LUMINOUS, from Silvaco International, Santa Clara, Calif., or other suitable numerical or analytical analysis tools that enable a transient analysis of photogenerated charge transport. With such tools, the time required to collect photogenerated charge as a function of the separation between multiple buried channel collection wells can be analyzed. Based on the analysis results, the separation required for achieving substantially complete charge collection by a super pixel within a specified image frame period can then be determined. Such analysis preferably accounts for substrate characteristics and dopant concentrations in the conventional manner. Given a specified subpixel separation, the corresponding number of subpixels needed to be provided in each super pixel then can be determined based on the selected super pixel size.

With this multi-subpixel super pixel architecture provided by the invention, each super pixel can collect a specified sequence of image frames at a selected frame rate with a high degree of sensitivity. Each subpixel stores its acquired photogenerated charge at the subpixel location itself; no secondary storage location is employed, and no opaque light shielding of storage areas is employed. As a result, and given the back-illuminated configuration of the imager array, a fill factor of substantially 100% is achieved, with a correspondingly high imager sensitivity. No decrease in sensitivity results from the independent control of subpixels or the high frame rate capability of the super pixel architecture. The quantum efficiency that is inherently provided by back-illumination of the imager further enhances the imager's sensitivity.

Turning now to the control of image acquisition, in operation, at the start of imager acquisition of a sequence of a selected number of frames, e.g., four image frames A, B, C, and D, the electronic shutters of the subpixels designated for frames B, C, and D are held "closed" while the shutters of the two subpixels designated for acquisition of frame A are "opened." The charge drains for all subpixels remain closed during this frame acquisition. After the first frame acquisition period, these A frame pixel shutters are "closed" and the two B frame pixel shutters are "opened." Then the C frame pixel shutters are opened. This sequence is continued until all four image frames are acquired by the imager.

Once all four image frames are acquired, the shutters of all subpixels are "closed" to maintain the stored image frame sequence, and the shutter drains of all subpixels can be biased if desired, such that any additional photogenerated charge in the substrate does not contaminate the stored image frame sequence as the sequence is transferred off-chip. In a similar manner, if desired, the shutter drains of a number or all of the subpixels can be briefly biased after each frame acquisition by a subpixel to remove any photogenerated charge remaining in the substrate at the frame acquisition period.

Referring to FIGS. 4A–4D, there are shown schematic cross sectional views of the example super pixel 14 having eight subpixels 15 for capturing a four-frame image sequence as the electronic shutters of the subpixels are controlled. In the figures are schematically represented each subpixel's buried channel 60 and photogenerated charge collection region 66 as the electronic shutter is controlled. Also shown are the subpixel gate control connections 22a, 22b, 22c, identified as 1A, 2A, 3, and so on, for the subpixels.

To capture frame A, the control voltages, $V_{I4}$, for subpixels 1A and 2A, the two subpixels designated for acquisition of frame A, are set at a high voltage, e.g., between about 15 V and about 21 V. The other six subpixel gate electrode voltages for the three other frames, namely, phases 1B and 2B, 1C and 2C, and 1D and 2D, are set at an intermediate voltage, e.g., between about 6 V and 12 V. This biasing produces the charge collection regions 66 shown in FIG. 4A for acquiring the A frame of the four-frame sequence during the first frame acquisition period. The gate electrode phase 3 of the super pixel is set at a low voltage, e.g., between about −6 V and 0 V, to electrically isolate adjacent subpixels as well as adjacent super pixels. The phase 3 voltage control level thus is common to all subpixels in the super pixel.

Note that even with the close packing of the 8 subpixels in the super pixel, the photogenerated charge collection region of the subpixels corresponding to a given image frame expand significantly in the substrate. This collection region expansion is due to the natural fringing out of the buried channel depletion region in the manner described above with regard to FIGS. 3A–3C. For reasonable voltage levels, the resulting expanded photogenerated charge collection region can be about 2–4 times larger than the surface area defined by a subpixel gate electrode area. This expansion enhances the high-speed capability of the imager.

Shown schematically in FIGS. 4A–D is the p-type buried layer 64, represented here for clarity as extending across each subpixel at a common depth, but preferably provided at varying depths in the manner described above. As explained above, this layer ensures that photogenerated charge in the substrate is collected only by the those subpixels having expanded collection regions 66 and not by the adjacent subpixels.

Figure 4A:
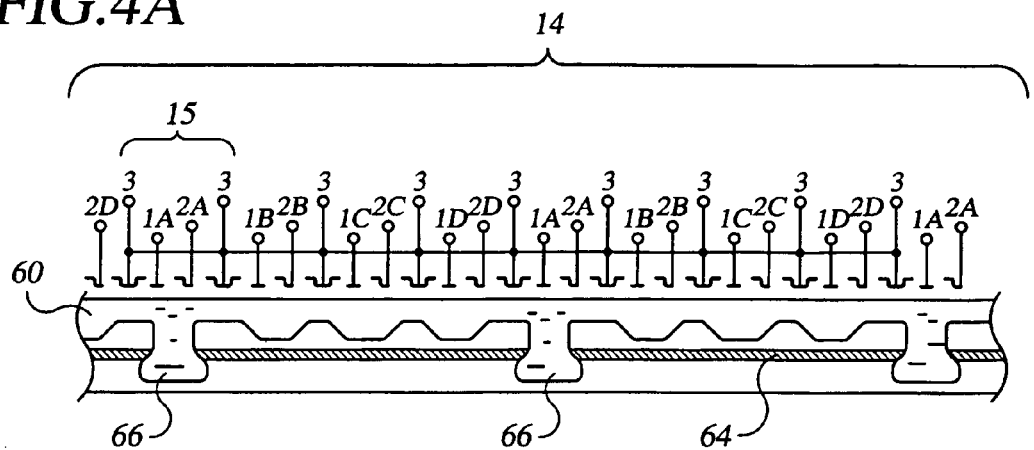
FIGS. 4A–4D are schematic cross-sectional views of a super pixel provided by the invention, shown as a first, second, third, and fourth image frame is acquired by the super pixel, respectively.
Figure 4B:
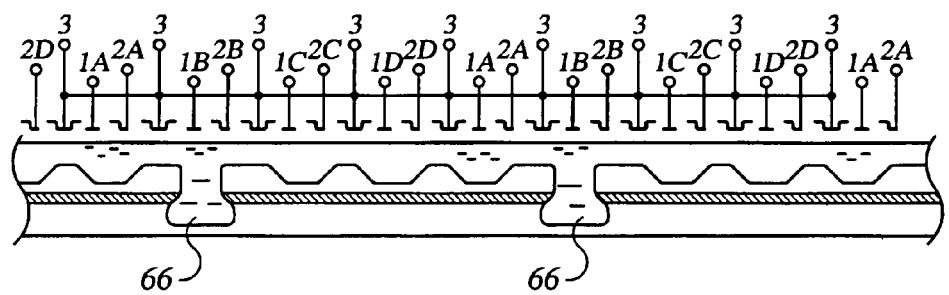
Figure 4C:
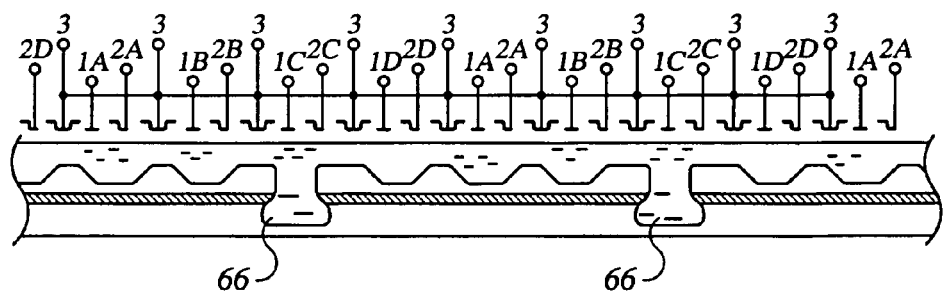
Figure 4D:
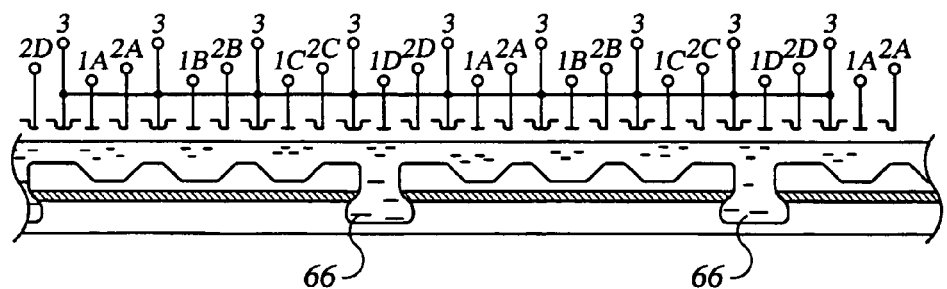

Turning back to FIG. 4B, the second image frame is captured by setting the control voltages for subpixels 1B and 2B at the high voltage level, setting gate electrode voltages 1A and 2A, 1C and 2C, and 1D and 2D to the intermediate voltage level, and maintaining a low voltage level at gate electrode phase 3. The intermediate voltage levels applied to subpixels 1A and 2A hold the charge collected during the first frame acquisition period at those subpixels in the manner shown in FIG. 4B. Then, as shown in FIGS. 4C and 4D, the remaining two frames are captured by continuing this sequence of control gate electrode voltage adjustment such that a charge collection region is formed at the subpixels designated for the third frame and then for the fourth frame during the corresponding third and fourth acquisition periods. At the end of the fourth frame acquisition period, each of the eight subpixels holds photogenerated charge collected during one of the four acquisition frame periods.

With this super pixel operation, each subpixel is independently controllable; as a result, the imager can acquire a sequence of image frames at frame rates that are significantly higher than that which would be set by conventional charge transfer at the end of a single image frame acquisition. Instead, the sequence of image frames is transferred only at the end of the multi-frame sequence acquisition, with each subpixel being independently controlled to store its collected charge until completion of this acquisition. This end-of-sequence transfer can be carried out at conventional charge transfer rates without impact of the image frame sequence acquisition rate.

Just as each subpixel of a super pixel can be independently controlled, the invention enables an extension to independent super pixel control across the imager array. For example, each super pixel can be provided with logic and independent control signals such that selected super pixels can be activated for specific frames in a sequence of image frames. In other words, during a given frame acquisition selected super pixels in the imaging array can be set to operate to collect an image sample for that frame. This enables control of an imager pattern for image collection that can be adjusted from frame to frame in an image frame sequence.

It is recognized in accordance with the invention that for some applications, it can be preferred to capture multiple sequences of images prior to transfer of acquired photogenerated charge from the super pixel sites. In such a scenario, a selected multiple of image sequences can be captured, with each subpixel maintaining stored photogenerated charge from sequence to sequence. As can be understood, the number of image frame sequences that can be captured by the imager is limited by the charge capacity of the subpixel charge collection regions; once the charge capacity of the regions is exceeded, subpixel saturation will occur. It is therefore preferred that the corresponding multiple of image frame sequences not be exceeded.

In addition, as each image sequence in a string of multiple image sequences is acquired, the subpixel assignment to frames of the sequences can be adjusted. In other words, from sequence to sequence, a given subpixel can be controlled to acquire differing image frames. For example, in the four-frame sequence example being described, a given subpixel could be assigned to the A frame for a first acquisition sequence, then to the B frame for a second acquisition sequence. The subpixel-frame assignment can further be rendered as a random sampling, i.e., the subpixel-frame assignment applied randomly from sequence to sequence. This enables random sampling of image frames and can be employed for a wide range of applications in which a random sampling of event data is desired.

The invention further enables selective weighting of each subpixel's collected photogenerated charge. Specifically, the amount of photogenerated charge collected by a given subpixel can be modulated by control of that subpixel's drain and gate bias voltages. Each subpixel in a super pixel can be thusly controlled to collect photogenerated charge to a desired extent. With this control, the image frames in a sequence being acquired can in effect be individually weighted, and the weighting can be adjusted from sequence to sequence.

Now turning back to FIG. 1 and the architecture of the imaging array, as shown in the figure, there can be included in the imaging array 12 two sacrificial super pixel columns 80a, 80b to collect parasitic light and dark current generated outside the imaging array regions of the substrate. A sacrificial row 82 of super pixels can also be included for collecting charge generated outside the imaging array in the substrate. A buffer row 84 of super pixels separates imaging array from an analog, serial charge register 86. Diode drain connections 88 are provided at the buffer row 84 of super pixels. Imaging array clock connections 90 are provided for each of the frames in the frame sequence to be captured; here a four-frame configuration is illustrated with frames A, B, C, and D. Table 1 below provides for this four-frame sequence example the high state clock electrodes for the sequence.

TABLE 1

| Frame capture | Clock Electrode High | Subpixels with open shutter |
| --- | --- | --- |
| A | IA11,IA21 | 1A,2A |
| B | IA12,IA22 | 1B,2B |
| C | IA13,IA23 | 1C,2C |
| D | IA14,IA24 | 1D,2D |

As shown in FIG. 1, the serial register 86 of the imaging array, here an example 512×512 array of super pixels, is configured for transferring a captured sequence of image frames from the super pixels to an off-chip location. The serial register is provided with a number of electronic charge storage locations, or pixels, corresponding to the selected image frame sequence length. For example, given a four-frame image sequence length, the serial register can be provided with 2064 pixel locations. 2048 of the register pixels are designated for collection of subpixel charge to be transferred from super pixel rows of the imaging array, with groups of four register pixels each associated with a corresponding super pixel column of the array. With this configuration, the four frames of image data are transferred from each super pixel into the corresponding four serial register pixels. Additional register pixels, e.g., the other 16 pixels of the serial register, 8 at each end of the register, can be provided to enable alignment of subpixel data corresponding to a common frame, and to enable binning of rows of image frame data, if desired.

At the ends of the serial register can be provided column binning registers 90a, 90b. Each column binning register includes a number of electronic charge storage location, or pixels, e.g., 8 in the example of a four-frame sequence, with four of the pixels employed for binning and the other four employed for dark current calibration and for frame alignment. Four of the pixels of the column binning registers are "above" the serial register 86, one pixel is at the end of the serial register, and the three remaining pixels are connected to an output amplifier 92a, 92b, through corresponding summing gates 94a, 94b and output gates 96a, 96b. The third phase of the last pixel of the column binning register is replaced by the summing gate.

Figure 5:
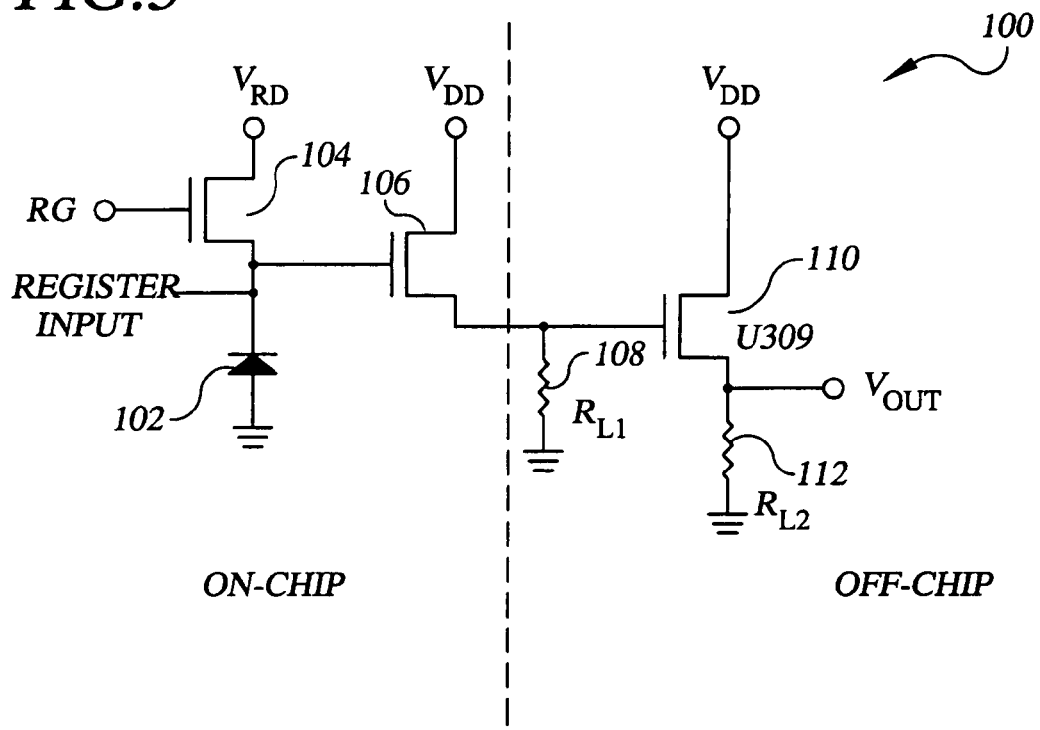
FIG. 5 is a circuit schematic of an example output amplifier provided by the invention for the CCD imager system of FIG. 1.

Referring also to FIG. 5, there is shown a circuit schematic of the configuration 100 of the output amplifiers 92a, 92b provided by the invention for transfer of the image frame sequence charge off-chip from the CCD. The amplifiers are configured with a floating diffusion capacitor 102, a reset transistor 104, and a sense transistor 106. Input from the serial register is provided at the capacitor node. An external load resistor 108, $R_{L1}$, of, e.g., between about 100 kΩ and about 200 kΩ, is provided for the sense transistor 106. The upper stage 110, U309, of a second-stage source follower is connected as shown to the output of the sense transistor 106. A second external load 112, $R_{L2}$, of at least about, e.g., 3 kΩ, is provided for this stage.

It can be preferable for many applications to provide the diffusion capacitor 102 and reset transistor 104 on-chip with the serial register, binning registers, and imaging array. The load resistors 108, 112, source follower 110, can be provided on a hybrid substrate that is included in the package with the imager chip. With this arrangement, the second source follower 110 provides drive for capacitive loads external to the package; such loads can be assumed to be, e.g., less than about 10 pf. It can also be preferable to include bypass capacitors of about 0.01 μf on all of the DC voltage bias connections shown, to filter any noise on those lines and prevent such noise from deteriorating the image signal.

With this configuration of output gates and amplifiers and a serial register, the image frame data from each super pixel can be transferred off-chip in a manner that preserves the correspondence of each subpixel with its corresponding image frame. For clarity, the identifiers of subpixel gate phases employed above will be used here. Recall from Table 1 above that frame A corresponds to subpixels 1A and 2A, frame B corresponds to subpixels 1B and 2B, frame C corresponds to subpixels 1C and 2C, and frame D corresponds to subpixels 1D and 2D, for a four-frame sequence, 8 subpixel example.

In one example technique for transfer of the subpixel data to the serial register, the image data from subpixel 2D, for the last frame, frame D, of the row of super pixels nearest the serial register location, is transferred column-wise into register pixels by clock control. This control also is employed to simultaneously transfer all other subpixel charge one subpixel "step" down the imager columns. Then the serial register is moved forward by one pixel step and the imaging array is again controlled to transfer subpixel charge one subpixel "step" down the imager columns, such that the image data from subpixel 2C, for the third frame, frame C, of each super pixel is transferred into register pixels. This controlled charge transfer is continued to transfer charge from subpixel 2B and subpixel 2A of each super pixel into serial register pixel locations.

For this four-frame image sequence example, once the charge from these four of the eight subpixels has been transferred to the serial register, then the serial register charge can be emptied to the output amplifiers and the sequence repeated to transfer the charge from subpixels 1A, 1B, 1C, and 1D to the serial register and the amplifiers. Alternatively, the charge from subpixels 1A, 1B, 1C, and 1D can be added to the charge in the serial register for subpixels 2A, 2B, 2C, and 2D prior to emptying of the register.

In this scenario, instead of controlled clocking of charge out of the register after the first half of each super pixel's subpixels have been loaded, the register is clocked backwards by three pixel positions such that pixel 2D of the register aligns with subpixel 1D of the super pixel columns in the imaging array. The charge from subpixel 1D is then added to the charge of pixel 2D in the register by clocking the imaging array charge down by one subpixel step. The entire charge for frame D of a super pixel is thereby collected at a single register position. This technique enables noiseless adding of subpixel charge corresponding to a given image frame at the register, such that each pixel transferred out of the register represents the entire charge collected by a super pixel for that frame.

After the transfer of charge from subpixel 1D to the register, the register is clocked forward by one pixel step and the imaging array charge is clocked down one subpixel step to add the charge from subpixel 1C to the charge of its partner subpixel, 2C, already in the register. This process is then repeated, in the manner described above, until the charge from each remaining subpixel is added to its corresponding subpixel for a given frame at the serial register.

This sequence of charge transfer to the serial register can then be repeated to bin rows of super pixel charge, i.e., to bin together corresponding subpixel charge for a row of super pixels. Then by clocking the register forward, the sequence of images as-collected by a super pixel row can be transferred off-chip. This process is continued to transfer all subpixel charge of corresponding frames off-chip until the entire image array of charge has been transferred.

For many applications, it can be preferred to employ the column binning registers 90a, 90b, shown in FIG. 1, for enabling on-chip, rather than off-chip, binning of super pixel columns, such that the noise contributed to the image signal by the binning process is minimized. A controlled clocking sequence similar to that described above for binning transfer of corresponding subpixels to the serial register can here be employed. At the start of the column binning process, the serial register is filled with subpixel charge arranged serially by column; it is here assumed that the corresponding subpixels of each super pixel have been binned at the register.

Then, to bin the columns, the charge of super pixels from column 1, frame D is transferred into the column bin register by shifting the serial register to the right by one pixel position. The column bin register is then clocked down one pixel position. The charge of super pixels from column 1, frame C is then transferred into the column bin register by another shift of the serial register by one pixel position. This process is repeated until the column bin register contains all four frames of subpixel data for the first column of super pixels in a given row of super pixels. At this point, the column bin register can then be emptied to the output gates and off-chip, and the sequence repeated to similarly bin the next column of pixel data.

Alternatively, column binning can be accomplished in the manner of the subpixel binning described above. In this scenario, the charge for the first column is retained in the column bin register and the register is then controllably clocked back by three pixel positions so that the frame D column 1 position of the column bin register is aligned with the frame D column 2 position of the serial register. The serial register is then shifted by one pixel position to the right to sum the frame D charge from columns 1 and 2. Thereafter, the column bin register is clocked by one pixel position down to align the frame C column 1 position of the column bin register with the frame C column 2 position of the serial register. The serial register is then again clocked by one pixel position to the right to add the frame C columns 1 and 2 charge together in the column bin register. This sequence is repeated to sum the super pixel columns 1 and 2 for frames A and B. As can be recognized, this process can then be repeated to continue binning of additional super pixel columns as desired, and the column bin register then clocked out to the output gate to provide a binned charge signal. With this binning process, a method for transferring charge from each subpixel to a serial register for transfer off-chip is complete.

Figure 7:
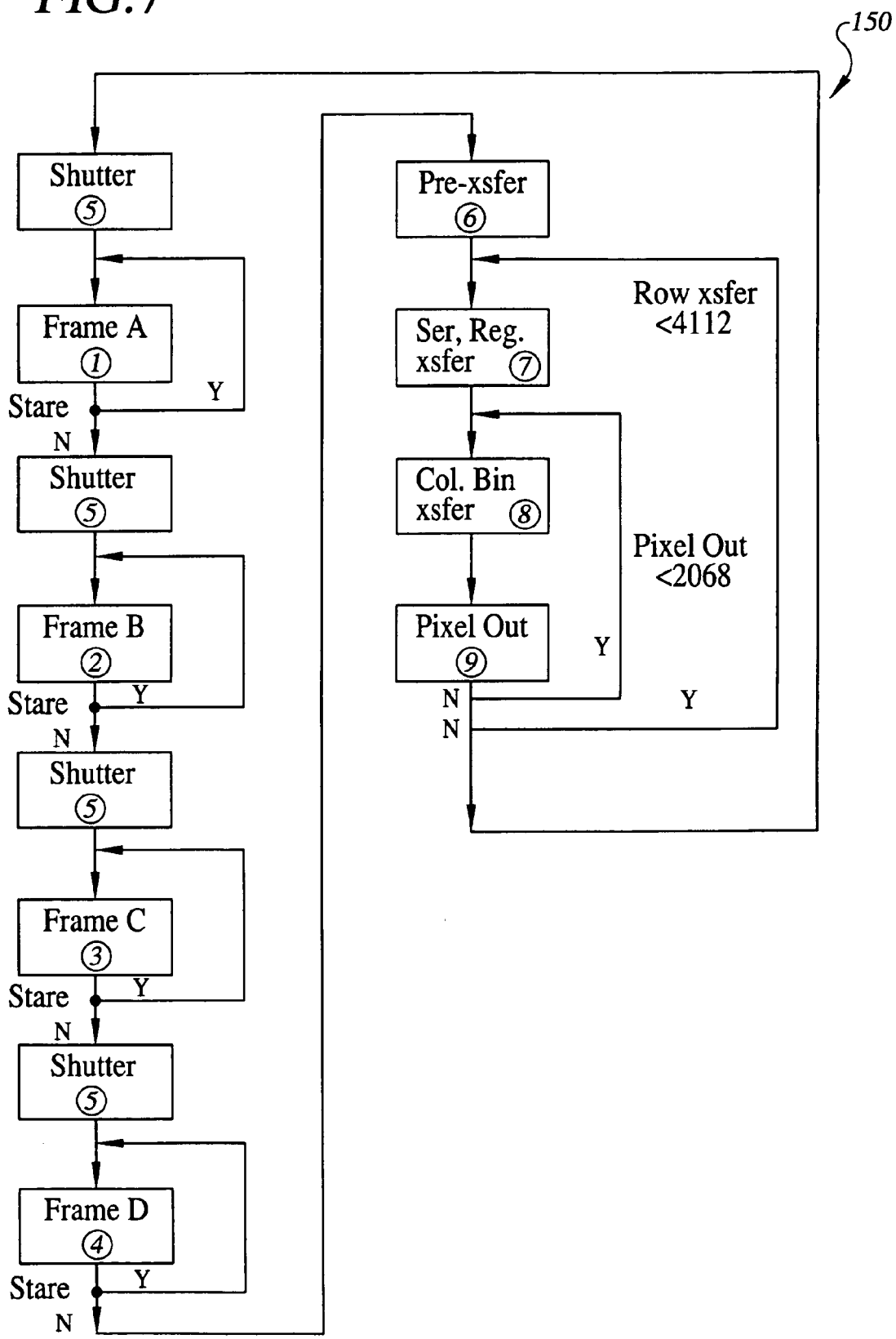
FIG. 7 is a state diagram for 9 of the 12 states in the timing diagram of FIGS. 6A–6D.

FIGS. 6A–6D provide timing diagrams that illustrate the signal levels for the example of a four-frame sequence capture and transfer off-chip. The time periods indicated in the timing diagrams are arbitrary. These figures identify each signal state by number, from state 1 to state 9. FIG. 7 is a state diagram 150 identifying each of these 9 states and the corresponding system operation for the four-frame sequence capture. In the example presented in the state diagram, the subpixels of each super pixel are transferred to the serial register without binning of corresponding subpixels in the register, and no row or column binning of super pixels is carried out. Table 2 below provides the full description of each clock signal identified in the timing diagram of FIGS. 6A–6D.

TABLE 2

| Clocks | Description |
| --- | --- |
| IA1-A | Imaging array phase 1 frame A |
| IA1-B | Imaging array phase 1 frame B |
| IA1-C | Imaging array phase 1 frame C |
| IA1-D | Imaging array phase 1 frame D |
| IA2-A | Imaging array phase 2 frame A |
| IA2-B | Imaging array phase 2 frame B |
| IA2-C | Imaging array phase 2 frame C |
| IA2-D | Imaging array phase 2 frame D |
| IA3 | Imaging array phase 3 |
| SD | Shutter Drain Bias |
| SR1 | Serial Register phase 1 |
| SR2 | Serial Register phase 2 |
| SR3 | Serial Register phase 3 |
| CBR1 | Column Binning Register phase 1 |
| CBR2 | Column Binning Register phase 2 |
| CBR3 | Column Binning Register phase 3 |
| SG | Summing Gate Bias |
| RG | Reset Gate Bias |

Table 3 below provides a description of each state in the state diagram of FIG. 7.

TABLE 3

| State # | FIGS. 6 & 7 State Description |
| --- | --- |
| 1 | Frame A acquisition period |
| 2 | Frame B acquisition period |
| 3 | Frame C acquisition period |
| 4 | Frame D acquisition period |
| 5 | Shutter close control command |
| 6 | Pretransfer of charge from array |
| 7 | Serial register subpixel row transfer |
| 8 | Column bin transfer |
| 9 | Subpixel charge transfer out |
| 10 | Serial register row reverse command |
| 11 | Column bin reverse command |
| 12 | Image array reverse command |

The state machine of FIG. 7 for operation of the imager of the invention can be implemented in any of a wide range of configurations. For example, the state machine logic can be implemented by way of programmable digital logic, application-specific integrated circuits (ASICs), digital signal processing systems, or other selected digital hardware implementation. The state machine logic can also be implemented by way of a computer-controlled system such as a PC-based data generating system. Such can be advantageous for enabling flexible adjustment of the imager's operational parameters, e.g., for adjusting frame rate, image frame sequence length, and number of subpixels designated for a given image frame.

Turning now to fabrication particulars for the CCD imager of the invention, a conventional two-metal level, three-polysilicon layer silicon CCD process can be employed where three-phase gating of each subpixel is desired. Two additional ion implantation steps are added in accordance with the invention; one to produce the subpixel electronic shutter drains between the vertical transfer channels and the other to produce the stepped, or vertically contoured, buried layer extending across each subpixel to enable electronic shutter operation.

In an example fabrication sequence employing a p-type silicon substrate of relatively high-resistivity, e.g., greater than about 3000 Ω·cm, n$^+$ shutter drain regions are first produced by, e.g., a dual ion implantation employing arsenic and phosphorus dopants. A relatively high-dose arsenic implantation is preferred for producing shutter drain regions with low sheet resistivities, and a lower-dose phosphorus implantation is preferred for reducing the capacitance and increasing the breakdown voltages of the region over that which would be obtained from a single arsenic implantation, given that the charging rate of the shutter drain is in part determined by the shutter drain capacitance. Both the area capacitance and the sidewall capacitance of the shutter drain implantation areas are reduced by the outdiffusion of the low-dose phosphorus implantation from the arsenic implantation. The resulting low sheet resistance and low capacitance values result in faster drain "open" and "close" switching times.

The electronic shutter buried layer is next produced, also by one or more ion implantations, preferably providing the vertical contouring of the buried layer that is optimal for electronic shutter operation. In the example of a p-type buried layer, the more shallow regions of the buried layer can be set at, e.g., about 1.4 μm below the silicon—silicon dioxide interface, and the more deep regions of the buried layer can be set at, e.g., about 2.0 μm below the silicon—silicon dioxide interface. These p-type buried layer stretches can be formed by, e.g., a boron ion implantation at a single energy, e.g., in the range of between about 1.5 MeV and about 2.0 MeV, at a dose of between about $6 \times 10^{11}$ and about $1 \times 10^{12}$ cm$^{-2}$, through a single stepped oxide mask, in the conventional manner. Alternatively, the p-type buried layer can be formed with a relatively low-energy ion implantation step, after which an epitaxial layer is grown to a thickness of, e.g., about 1 μm to 2 μm where the n-type buried channel will be formed. Whatever process is selected for producing the p-type buried layer and the n-type buried channel, the buried channel is preferably offset from channel stop regions, e.g., p$^+$ channel regions, by about 1 μm to avoid avalanche breakdown when a subpixel shutter control is set to "open" that subpixel's shutter.

With the fabrication of the electronic shutter drains and buried layer, the CCD fabrication then proceeds in the conventional manner for producing a back-illuminated, buried channel device structure. It can be preferred for many applications to employ metal bus lines for the subpixel control voltage electrodes, i.e., the gate electrodes, as well as the shutter drain control electrodes, of the CCD subpixels to enhance the speed of the device, as described earlier. Metal, being relatively lower in resistivity than polysilicon and impurity-doped layers, enables enhanced clock signal speed.

Referring back to FIGS. 2A and 2B, in one example implementation, Al/Si metal lines 26, having a sheet resistance of, e.g., about 0.05 Ω/□, are provided perpendicular to the polysilicon gate electrodes and parallel to the shutter drain dopant. The metal lines are spaced correspondingly to enable enhanced speed, as well as high yield. For example, given the 96 μm super pixel example above, with a four-frame image acquisition sequence and 9 clock phases per super pixel, for controlling 1A, 2A, 1B, 2B, 1C, 2C, 1D, 2D, and 3, the metal lines can be spaced about 1200 μm apart. As explained above, the enhanced speed resulting from the use of metal lines is particularly advantageous given that the metal lines are employed for independently addressing subpixels of each super pixel.

To further improve device yield, the metal lines can be provided on top of an oxidized fourth layer of polysilicon 28, to electrically isolate the first three polysilicon layers, employed as the three-phase CCD gates, from the metal strapping. In addition, to smooth the imaging array surface topography for the metal lines, after oxidation of the fourth layer of polysilicon and before the first Al/Si metal layer deposition a planarizing layer 27 can be deposited. For example, there can be deposited a composite tri-layer of 1000 Å-thick TEOS oxide, 5000 Å-thick boro-phosphosilicate glass, and 1000 Å-thick TEOS oxide on the oxidized fourth layer of polysilicon to substantially planarize the top surface of the structure for improved metal line deposition quality. As can be recognized, other planarization processes that are compatible with CCD microfabrication can alternatively be employed.

A 5 cm×5 cm, CCD imager having a 512×512 super pixel element array with 96 µm super pixel architecture given here was fabricated with eight subpixels in each super pixel, to enable the four-frame sequence configuration described above. To measure the frame rate and multi-frame storage performance of the imager, a pulsed LED was employed as a light source to be imaged. The LED was of blue illumination with a peak response at 460 nm and having a 40 ns pulse duration. A highpass filter with a cutoff frequency of about 550 nm was positioned between the LED and imager to reduce the long-wavelength illumination of the signal.

To measure the static isolation of captured charge from a given image frame between subpixels in a common super pixel, the LED was pulsed "on" during a first frame, frame A, in a sequence of four image frames, and then turned off for the remaining three frames B, C, and D of the four frame sequence. The subpixel electronic shutters were "opened" and "closed" in sequence during each corresponding frame in the manner described above. The LED pulse was approximately centered in time in the middle of the A frame acquisition period, 2 ms, so that it could be assured that substantially all of the photoelectrons generated in response to the LED pulse were collected by the corresponding subpixels. The extinction ratio between the A frame and the other three frames B, C, and D, was calculated from the measured results. Extinction ratio is here defined as the ratio of photoelectrons collected by A frame subpixels during the A frame acquisition period to the photoelectrons collected by the other subpixels B, C, and D.

Figure 8:
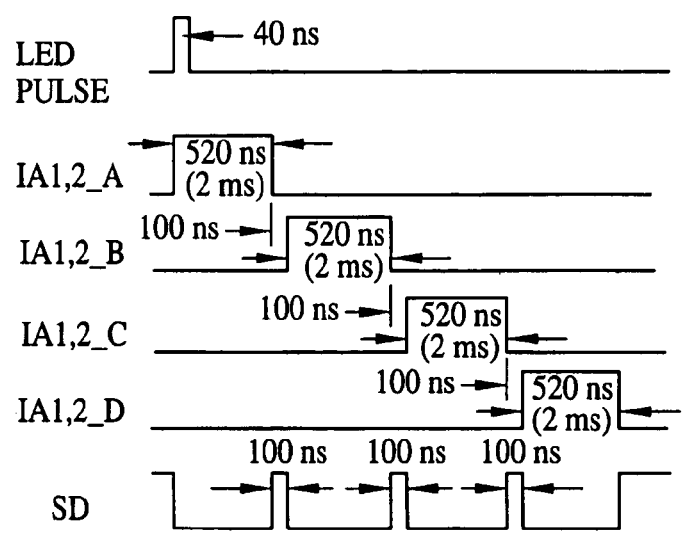
FIG. 8 is a timing diagram for testing the response of an experimental CCD imager system like that of FIG. 1.
Figure 6B:
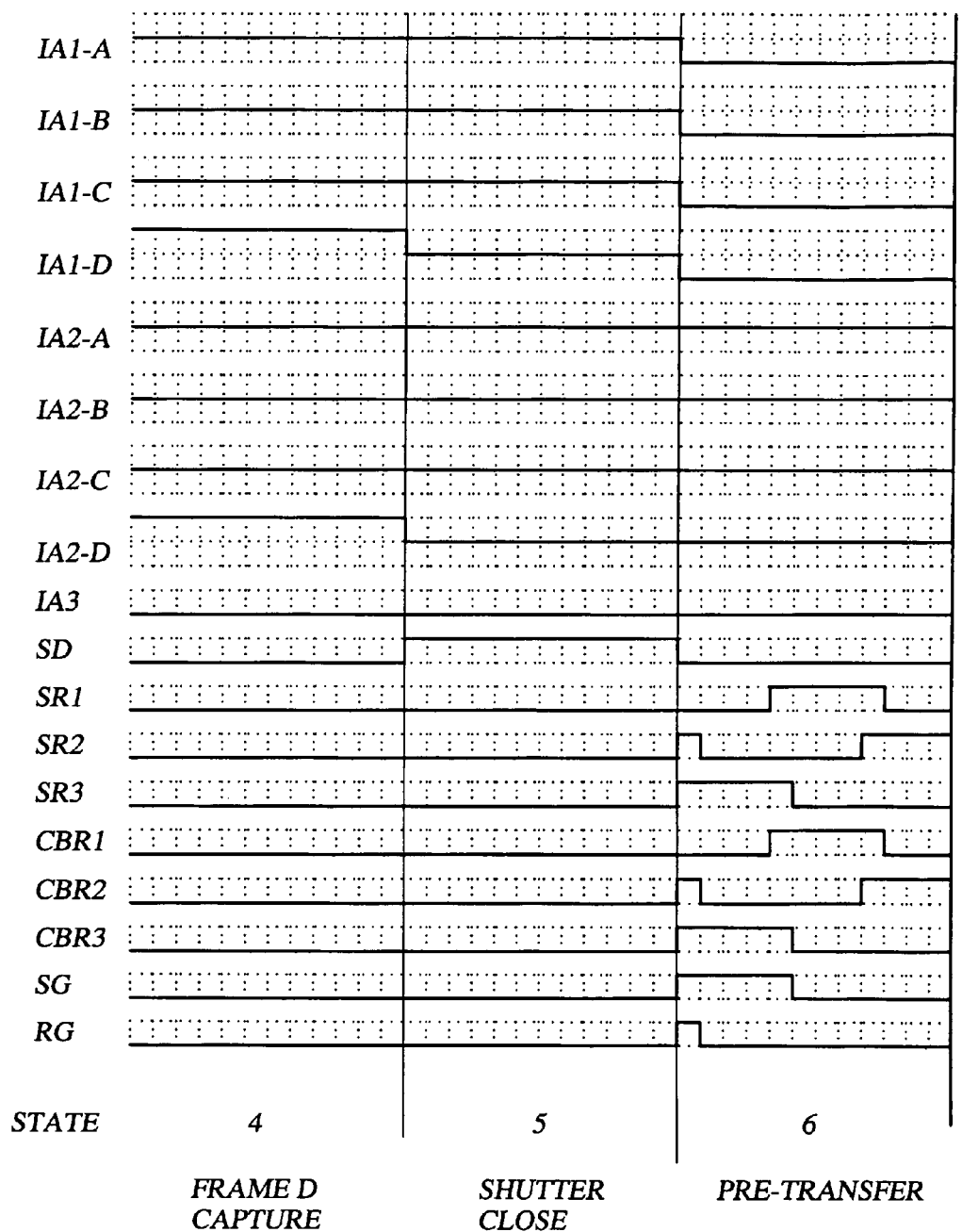
Figure 6C:
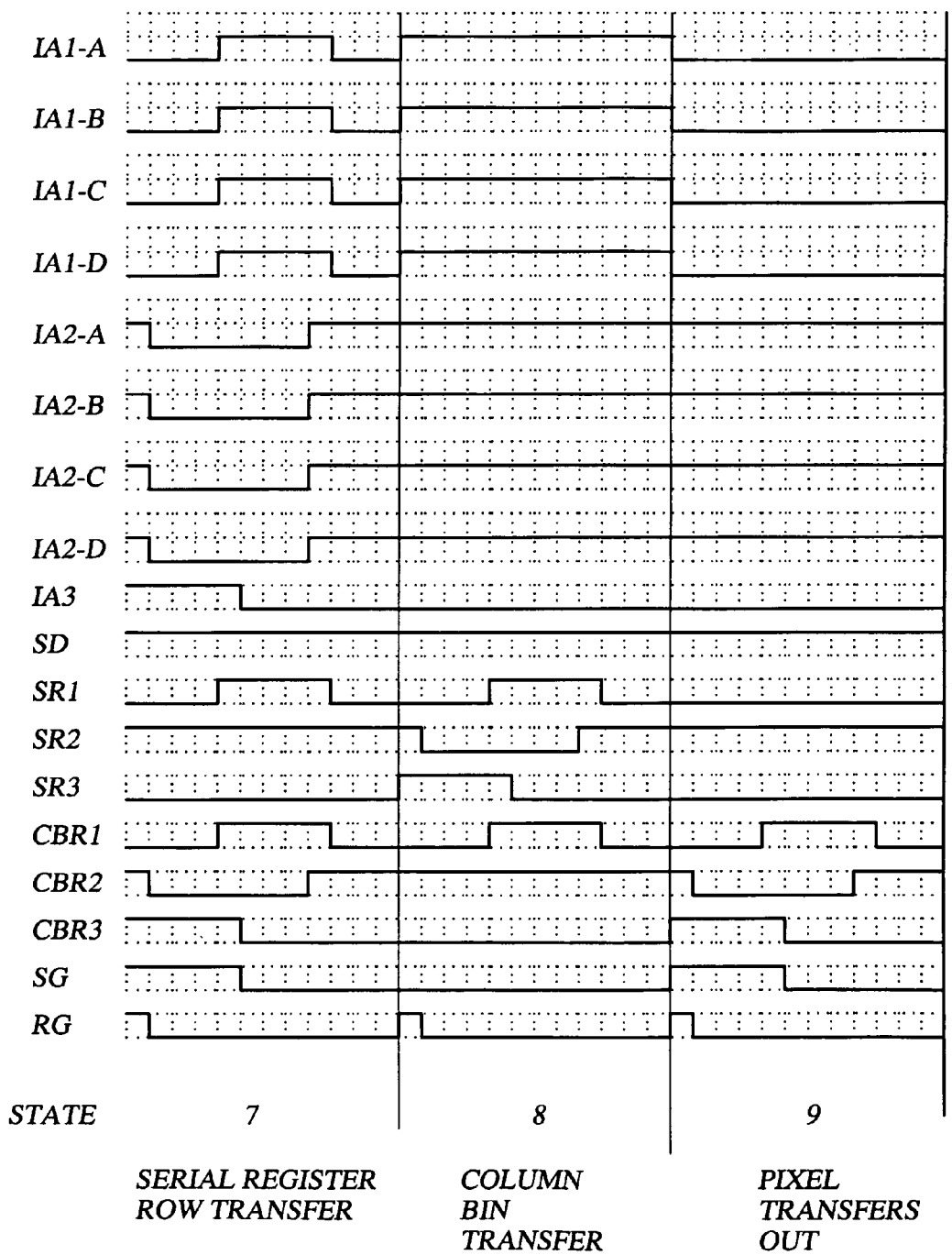
Figure 6D:
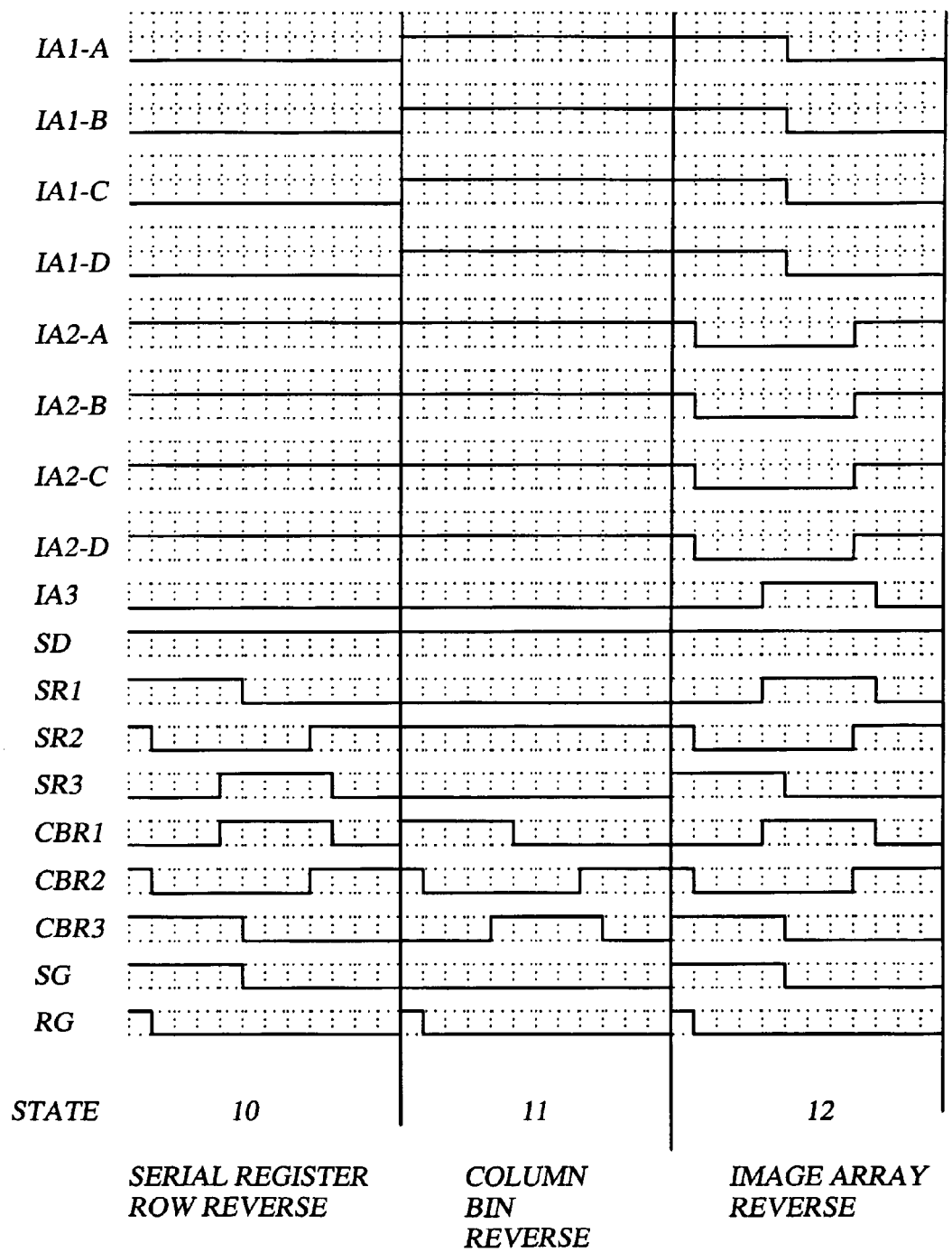

FIG. 8 provides the timing sequence employed for controlling the shutters of the subpixels in the four-frame sequence and the 40 ns LED pulse during the A frame acquisition period. With this sequence, it was found that the extinction ratio between the subpixels for frames A and B was about 2148, the extinction ratio between the subpixels for frames A and C was about 1157, and the extinction ratio between the subpixels for frames A and D was about 1659.

It is understood that for a given wavelength of imager illumination, the thickness of the CCD imager substrate, the distance between subpixels, and the corresponding photoelectron absorption by the substrate impacts the subpixel extinction ratio within a super pixel. As the illumination wavelength is increased, the absorption length of the illumination increases in the substrate, resulting in a corresponding decrease in extinction ratio for a given substrate thickness. As the substrate is increased in thickness, the extinction ratio can be improved for a given wavelength. It is thus to be recognized that achievable extinction ratio is an application- and illumination-specific performance parameter that can be optimized by fabrication parameters.

Figure 9:
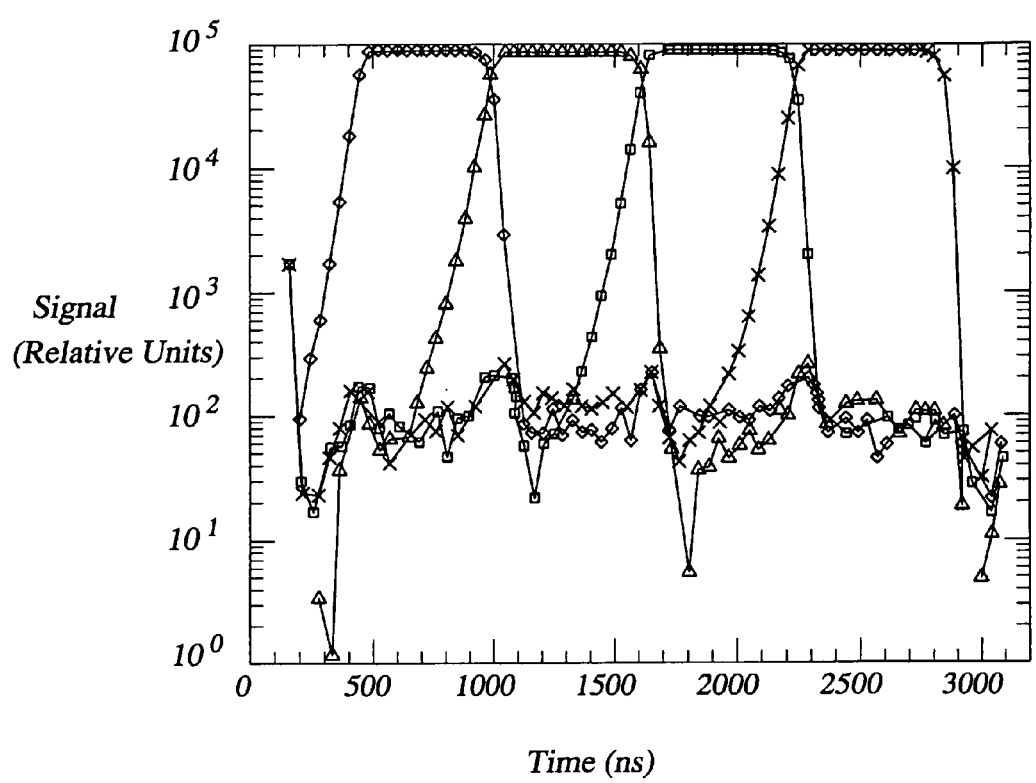
FIG. 9 is a plot of signal response as a function of pulsed illumination duration for an experimental CCD imager system like that of FIG. 1.

In order to measure the super pixel frame rate performance, the LED was also pulsed for its 40 ns period and stepped in 40 ns time increments through each of the four shutter-open frames A, B, C, and D, with the electronic shutter timing given in FIG. 8 employed for the subpixels. Each frame acquisition period was 520 ns in duration, with 100 ns separating the time between subpixel electronic shutter "opening" and "closing." FIG. 9 is a plot of photoelectron charge signal response as a function of LED pulse time. The maximum extinction ratio, as defined above, was for each frame found to be greater than 1100 at an effective frame capture rate of 1.612 MHz, and thus was found to be similar to the static response extinction ratio.

The subpixels for all four frames performed similarly, with shutter "closing" times, of about 150 ns, found to be shorter than shutter "opening" times, of about 350 ns. The slower shutter "opening" response is understood to be the result of photoelectrons remaining in the substrate and not captured by the end of a frame period and thus needing to diffuse to a subpixel collection region whose shutter is then "opening."

From the foregoing, it is apparent that the CCD imaging array of the invention provides an elegant approach for enabling very high speed image acquisition while at the same providing high imaging sensitivity. Control electrodes and connections for independent electronic shuttering of subpixels within each super pixel result in the ability to acquire and then store an image frame sample at a super pixel while subsequent image frame samples are acquired and stored by the super pixel. The design is flexible enough to accommodate a range of image acquisition, transfer, and binning scenarios while preserving its speed and sensitivity advantages. It is recognized, of course, that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

We claim:

1. A charge-coupled imager for imaging a sequence of image frames, the imager comprising:
    an array of super pixels disposed in a semiconductor substrate having a surface that is accessible to incident illumination, each super pixel including a plurality of independently-controlled subpixels, each subpixel of a super pixel corresponding to a frame in the sequence of image frames and each subpixel including:
        a doped photogenerated charge collection channel region opposite the illumination accessible substrate surface;
        a charge collection channel region control electrode;
        doped charge drain regions adjacent to the channel region;
        a charge drain region control electrode; and
        a doped charge collection control layer in the substrate below the charge collection channel region;
    the charge collection channel region, the charge drain regions, and the charge collection control layer each being characterized by a dopant type and dopant concentration for expanding the charge collection channel region in response to a charge collection control voltage applied to the channel region control electrode, to collect in the charge collection channel region photogenerated charge from the substrate during the image frame corresponding to that subpixel, and for contracting the collection channel region in response to a charge storage control voltage applied to the channel region control electrode, to store the collected photogenerated charge in the charge collection channel region and collect substantially no additional photogenerated charge as other subpixels of the super pixel collect photogenerated charge corresponding to other frames of the image frame sequence.

2. The charge-coupled imager of claim 1 wherein the semiconductor substrate comprises a p-type silicon substrate, the charge collection channel region comprises an n-type region, the charge drain regions comprise n-type regions, and the charge collection control layer comprises a p-type layer.

3. The charge-coupled imager of claim 2 wherein the semiconductor substrate comprises a p$^-$ silicon substrate, the charge drain regions comprise n$^+$ regions, and the charge collection control layer comprises a p$^+$ layer.

4. The charge-coupled imager of claim 1 wherein the charge collection channel region comprises a buried channel disposed adjacent to a substrate surface opposite the illumination-accessible substrate surface.

5. The charge-coupled imager of claim 4 wherein the charge collection control layer includes first sections that are at a first depth in the substrate and located under a first section of the charge collection channel region and all of the charge drain regions, and includes second sections that are at a second depth in the substrate different than the first depth and located under a second section of the charge collection channel region.

6. The charge-coupled imager of claim 1 wherein the charge collection control voltage is selected to expand a depletion region of the charge collection channel region into the substrate to a depth greater than a depth of the charge collection control layer.

7. The charge-coupled imager of claim 1 wherein the charge storage control voltage is selected to contract a depletion region of the charge collection channel region into the substrate to a depth less than a depth of the charge collection control layer, and wherein a charge drain control voltage is selected to expand a depletion region of the charge drain regions to a depth greater than a depth of the charge collection control layer.

8. The charge-coupled imager of claim 1 wherein the illumination-accessible substrate surface is a back side of the substrate and wherein the control electrodes are disposed on a front side of the substrate.

9. The charge-coupled imager of claim 1 wherein the charge collection channel region control electrode comprises three electrodes corresponding to three-phase photogenerated charge collection by the charge collection channel region.

10. A charge-coupled imager for imaging a sequence of image frames, the imager comprising:
an array of super pixels disposed in a semiconductor substrate having a surface that is accessible to incident illumination;
a plurality of subpixels provided for each super pixel, each subpixel corresponding to a frame in the sequence of image frames and each subpixel including:
a doped photogenerated charge collection channel region opposite the illumination-accessible substrate surface,
a charge collection channel region control electrode,
doped charge drain regions adjacent to the channel region,
a charge drain region control electrode, and
a doped charge collection control region; and
a channel region control voltage connection provided to each subpixel on a substrate surface opposite the illumination-accessible surface, each subpixel channel region control voltage connection configured for independent collection and storage of photogenerated charge from the substrate at the charge collection channel region of a subpixel during a corresponding frame in the sequence of image frames.

11. The charge-coupled imager of claim 10 further comprising a drain region control voltage connection provided to each subpixel on the substrate surface opposite the illumination-accessible surface, each subpixel drain region control voltage connection being configured for drainage of photogenerated charge from the substrate to a subpixel drain region in response to a drain region control signal.

12. The charge-coupled imager of claim 10 wherein the subpixel channel region control voltage connection is configured for collection and storage of photogenerated charge from the substrate at the charge collection channel region of at least two subpixels during a corresponding frame in the sequence of image frames.

13. The charge-coupled imager of claim 10 wherein the subpixel channel region control voltage connection is configured for subpixel-specific weighting of collection and storage of photogenerated charge from the substrate at each subpixel.

14. The charge-coupled imager of claim 10 wherein the subpixel channel region control voltage connection is configured for control of the correspondence between subpixels and image frames.

15. The charge-coupled imager of claim 10 wherein the subpixel channel region control voltage connection is configured for independent collection and storage of photogenerated charge from the substrate at the charge collection channel region of a subpixel during a corresponding frame in multiple sequences of image frames.

16. The charge-coupled imager of claim 10 wherein the subpixel channel region control voltage connection comprises metal control signal lines for delivering voltage control signals to the charge collection channel region control electrodes and the charge drain control electrodes.

17. The charge-coupled imager of claim 16 further comprising semiconducting isolation lines provided between the metal control signal lines and the charge collection channel region control electrodes and the charge drain control electrodes.

18. The charge-coupled imager of claim 10 further comprising a serial output register connected to accept a sequence of image frame charge from each super pixel after the image frame sequence is collected and stored at each super pixel.

19. The charge-coupled imager of claim 18 further comprising a column binning register connected to the serial output register image frame data to accept and sum image frame charge from columns of super pixels.

20. The charge-coupled imager of claim 19 wherein the serial output register and the column binning register are disposed in the semiconductor substrate.

21. A charge-coupled imager for imaging a sequence of image frames, the imager comprising:
an array of super pixels disposed in a semiconductor substrate having a surface that is accessible to incident illumination; and
a number of subpixels provided for each super pixel, each subpixel of a super pixel corresponding to a frame in the sequence of image frames and each subpixel including:
a doped photogenerated charge collection channel region opposite the illumination-accessible substrate surface;
a charge collection channel region control electrode;
doped charge drain regions adjacent to the channel region;

a charge drain region control electrode; and a doped charge collection control region;

the number of subpixels included in each super pixel being selected based on length of image frame sequence and frame rate, to collect photogenerated charge from each frame in the image frame sequence by at least one corresponding subpixel of the super pixel and store the collected charge at the corresponding subpixel as other subpixels collect photogenerated charge from other frames in the image frame sequence.

22. The charge-coupled imager of claim 21 wherein the number of subpixels is selected based further on charge collection efficiency that is characteristic of photogenerated charge in the substrate, for collecting substantially all photogenerated charge from the substrate at prespecified subpixels during a corresponding frame.

23. The charge-coupled imager of claim 21 wherein the number of subpixels is selected to collect and store at the super pixel each frame of the image frame sequence before transferring the image frame sequence from the super pixel.

24. The charge-coupled imager of claim 21 wherein the number of subpixels comprises at least two subpixels corresponding to each frame in the image frame sequence.

* * * * *

UNITED STATES PATENT AND TRADEMARK OFFICE
CERTIFICATE OF CORRECTION

| | | |
|---|---|---|
| PATENT NO. | : 7,091,530 B1 | Page 1 of 1 |
| APPLICATION NO. | : 10/612174 | |
| DATED | : August 15, 2006 | |
| INVENTOR(S) | : Robert K. Reich | |

It is certified that error appears in the above-identified patent and that said Letters Patent is hereby corrected as shown below:

Please delete the paragraph titled 'STATEMENT REGARDING FEDERALLY SPONSORED RESEARCH' encompassing, Column 1, lines 13-16:

"This invention was made with Government support under Contract No. F19628-00-C-0002, awarded by the Department of Air Force. The Government has certain rights in the invention."

and replace with:

--This invention was made with government support under Contract No. F19628-95-C-0002 awarded by the U.S. Air Force. The government has certain rights in this invention.--

Signed and Sealed this
Second Day of October, 2012

David J. Kappos
*Director of the United States Patent and Trademark Office*